United States Patent
Singh et al.

(10) Patent No.: US 9,177,951 B2
(45) Date of Patent: Nov. 3, 2015

(54) THREE-DIMENSIONAL ELECTROSTATIC DISCHARGE SEMICONDUCTOR DEVICE

(71) Applicant: GLOBALFOUNDRIES Inc., Grand Cayman (KY)

(72) Inventors: Jagar Singh, Clifton Park, NY (US); Andy Wei, Queensbury, NY (US); Mahadeva Iyer Natarajan, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/148,221

(22) Filed: Jan. 6, 2014

(65) Prior Publication Data

US 2015/0194419 A1   Jul. 9, 2015

(51) Int. Cl.
| | |
|---|---|
| *H01L 27/02* | (2006.01) |
| *H01L 21/306* | (2006.01) |
| *H01L 21/308* | (2006.01) |
| *H01L 29/06* | (2006.01) |

(52) U.S. Cl.
CPC .......... *H01L 27/0259* (2013.01); *H01L 21/308* (2013.01); *H01L 21/30604* (2013.01); *H01L 27/0251* (2013.01); *H01L 27/0255* (2013.01); *H01L 29/0657* (2013.01)

(58) Field of Classification Search
IPC .................................................. H01L 29/0657
See application file for complete search history.

(56) References Cited

U.S. PATENT DOCUMENTS

| | | | | |
|---|---|---|---|---|
| 4,236,122 | A * | 11/1980 | Cho et al. .................... | 372/45.01 |
| 5,028,974 | A * | 7/1991 | Kitagawa et al. ............. | 257/149 |
| 5,164,813 | A * | 11/1992 | Blackstone et al. .......... | 257/623 |
| 5,260,588 | A * | 11/1993 | Ohta et al. ....................... | 257/93 |
| 6,730,936 | B2 * | 5/2004 | Yukimoto ........................ | 257/88 |
| 6,797,992 | B2 * | 9/2004 | Hamerski et al. ............. | 257/112 |
| 6,909,122 | B2 * | 6/2005 | Taninaka et al. ................ | 257/93 |
| 7,122,412 | B2 * | 10/2006 | Chen et al. ..................... | 438/157 |
| 7,560,784 | B2 * | 7/2009 | Cheng et al. ................... | 257/401 |
| 7,709,847 | B2 * | 5/2010 | Lee ................................ | 257/94 |
| 7,868,428 | B2 * | 1/2011 | Goodrich et al. ............. | 257/656 |
| 8,455,949 | B2 * | 6/2013 | Gossner et al. ................ | 257/355 |
| 8,569,867 | B2 * | 10/2013 | Inaba ............................. | 257/574 |
| 2009/0008721 | A1 * | 1/2009 | Furuta ............................ | 257/369 |
| 2014/0264600 | A1 * | 9/2014 | Adam et al. ................... | 257/347 |
| 2015/0014809 | A1 * | 1/2015 | Wang et al. .................... | 257/506 |

\* cited by examiner

*Primary Examiner* — Eugene Lee
(74) *Attorney, Agent, or Firm* — Wayne F. Reinke, Esq.; Heslin Rothenberg Farley & Mesiti P.C.

(57) ABSTRACT

Three-dimensional electrostatic discharge (ESD) semiconductor devices are fabricated together with three-dimensional non-ESD semiconductor devices. For example, an ESD diode and FinFET are fabricated on the same bulk semiconductor substrate. A spacer merger technique is used in the ESD portion of a substrate to create double-width fins on which the ESD devices can be made larger to handle more current.

12 Claims, 5 Drawing Sheets

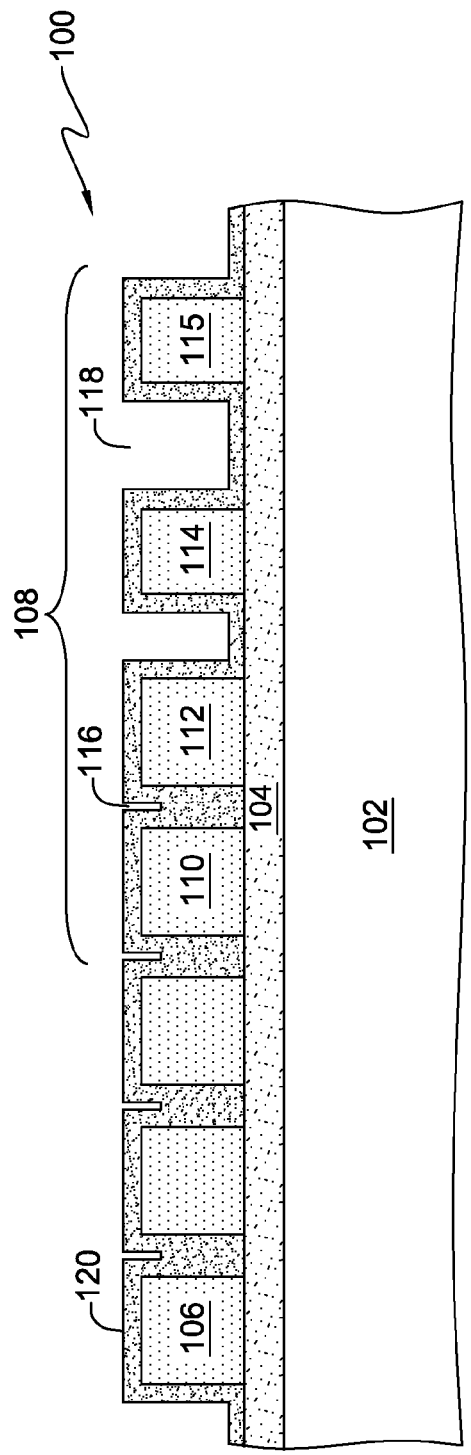
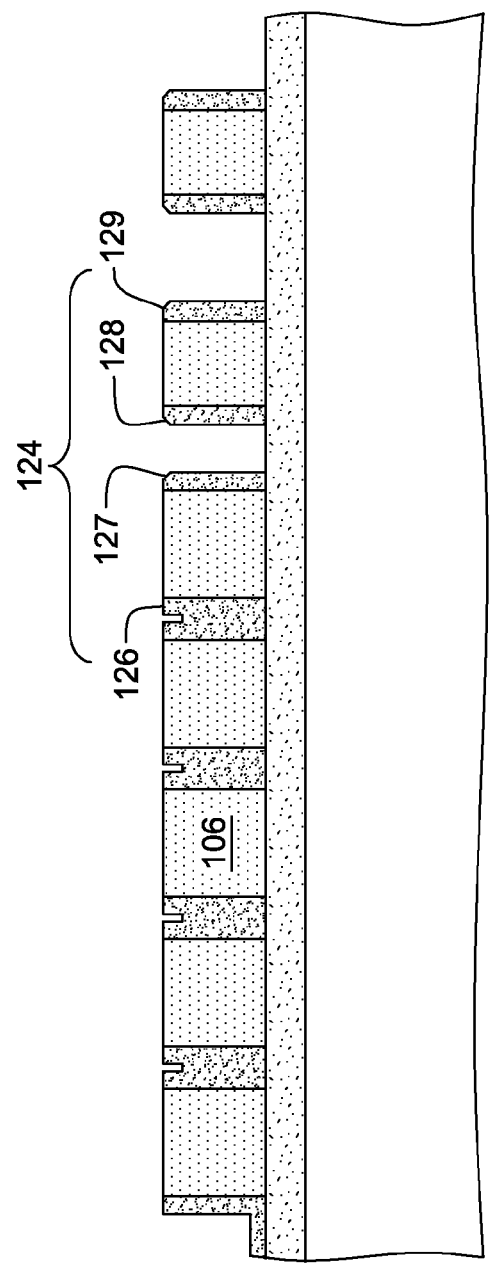
FIG. 1
FIG. 2

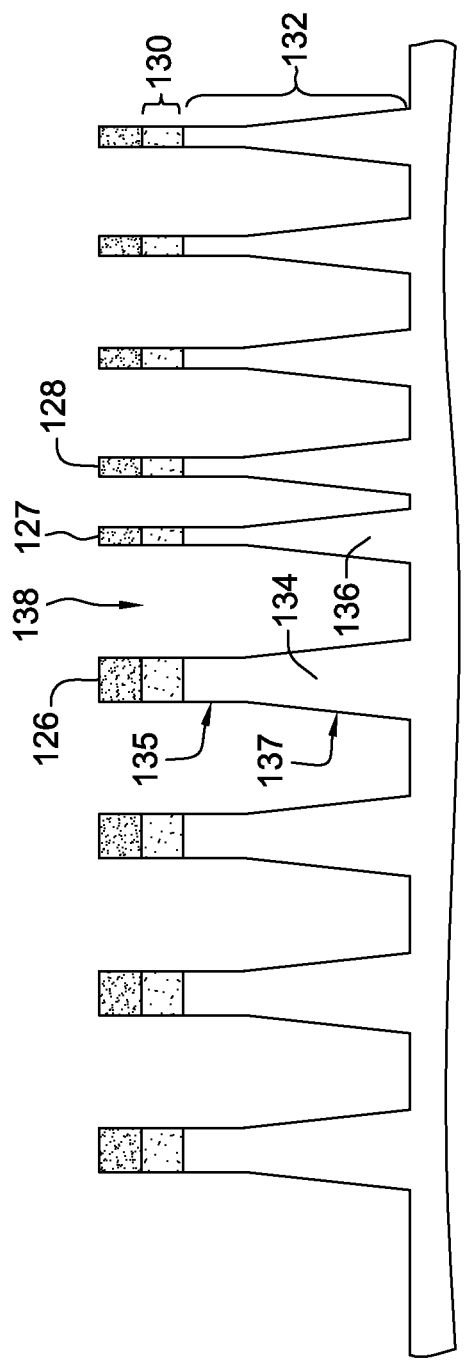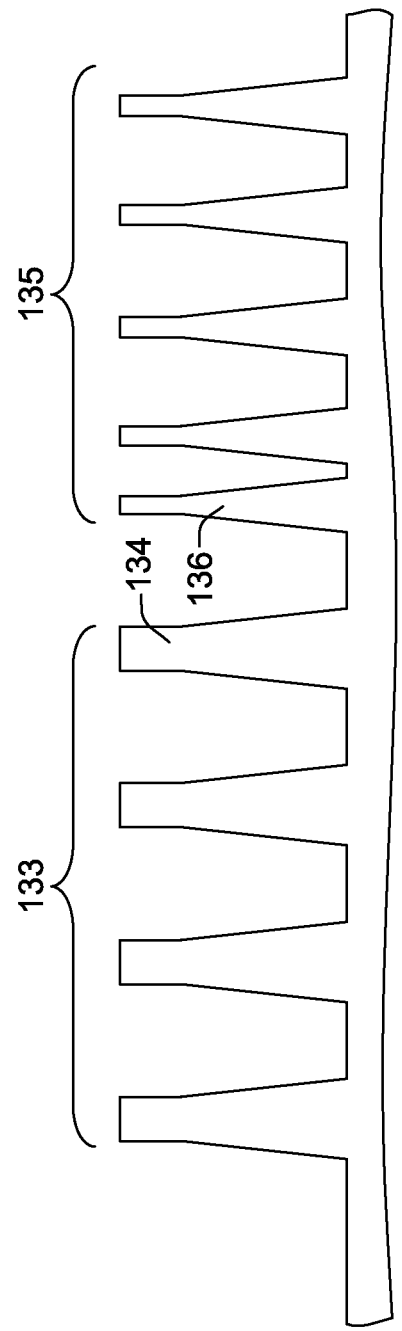

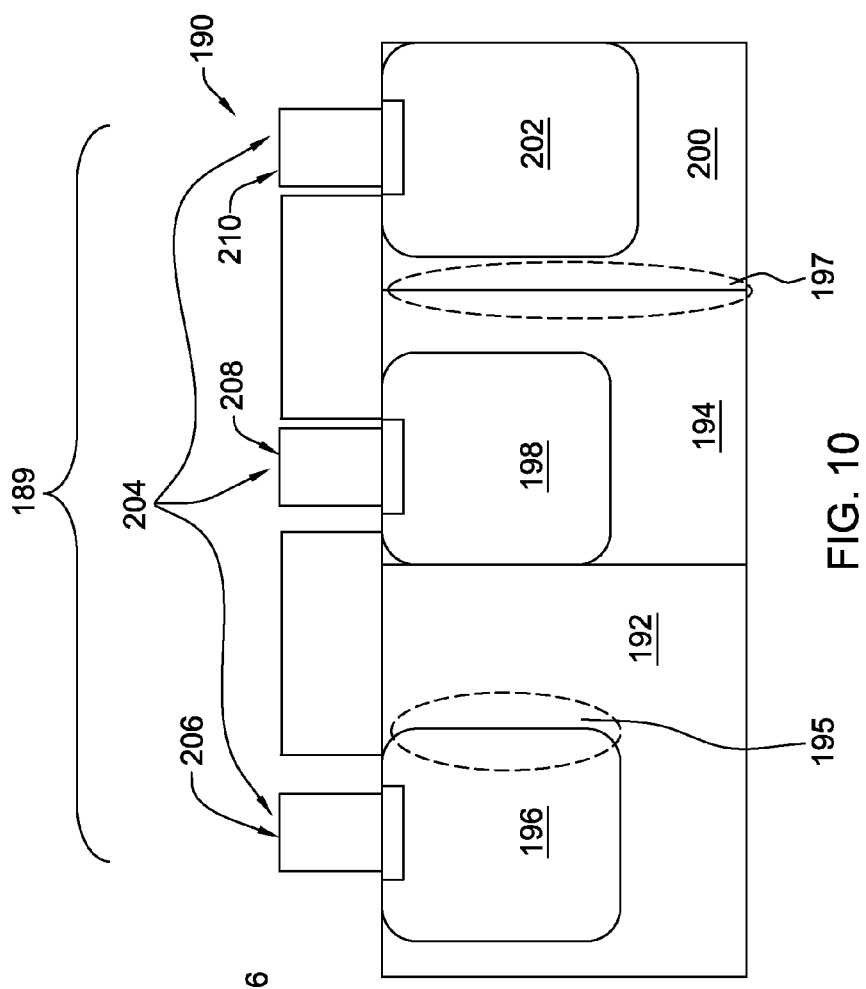
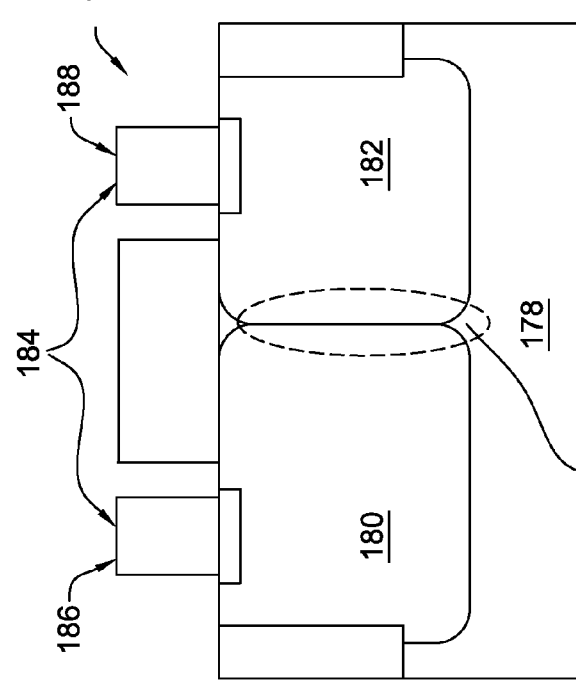

THREE-DIMENSIONAL ELECTROSTATIC DISCHARGE SEMICONDUCTOR DEVICE

BACKGROUND OF THE INVENTION

1. Technical Field

The present invention generally relates to electrostatic discharge semiconductor devices and methods of fabricating same, and more particularly, to double-width, three-dimensional (3D) electrostatic discharge (ESD) semiconductor devices and common fabrication thereof with 3D non-ESD semiconductor device(s).

2. Background Information

Semiconductor devices, such as integrated circuits, are at a risk of damage owing to an occurrence of overvoltages, such as electrostatic discharge (ESD) events, typically as a result of handling by, for instance, humans, machines or both. As the integration density of semiconductor devices increases and the corresponding size of circuit elements decreases, a need continues to exist for better protection of the semiconductor devices against such overvoltages.

SUMMARY OF THE INVENTION

The shortcomings of the prior art are overcome and additional advantages are provided through the provision, in one aspect, of a semiconductor device for electrostatic discharge (ESD). The device includes a semiconductor substrate, at least one raised semiconductor structure coupled to the substrate, the at least one raised structure having a width of about 5 nm to about 50 nm, and at least one electrostatic discharge (ESD) semiconductor device situated at a top portion of the at least one raised structure. The at least one ESD device includes a diode, and the diode includes a well in the at least one raised structure, the well being one of n-type and p-type. The diode further includes an anode of a type opposite the well and having a depth in the well of about 0.05 μm to about 3 μm, a cathode of a same type as the well and having a depth in the well of about 0.05 μm to about 3 μm, at least one contact electrically coupled to the anode, and at least one other contact electrically coupled to the cathode.

In accordance with another aspect, a semiconductor chip includes a bulk semiconductor substrate, a plurality of raised semiconductor structures coupled to the substrate, at least one and less than all of the plurality of raised semiconductor structures having a width of about 5 nm to about 50 nm, at least one and less than all of the plurality of raised structures being wider than a remainder of the plurality of raised structures. The semiconductor chip further includes a plurality of electrostatic discharge (ESD) semiconductor devices situated at top within top portions of the wider raised semiconductor structures, and a plurality of at least one type of non-ESD semiconductor device situated at top portions of the remainder of the plurality of raised semiconductor structures.

In accordance with yet another aspect, a method of creating a three-dimensional electrostatic discharge semiconductor device includes providing a semiconductor structure, the structure including a semiconductor substrate, a blanket layer of a masking material over the semiconductor substrate and a plurality of mandrels over the masking layer. The method further includes creating merged spacers between the plurality of mandrels, removing the mandrels, etching to reduce a height of the merged spacers, etching the semiconductor substrate using the reduced height spacers as a hard mask to create raised semiconductor structures having a width at least equal to the merged spacers, and creating one or more ESD semiconductor devices at a top portion of at least one of the raised structures.

These and other features and advantages of this invention will become apparent from the following detailed description of the various aspects of the invention taken in conjunction with the accompanying drawings.

BRIEF DESCRIPTION OF THE DRAWINGS

FIG. 1 is a cross-sectional elevational view of one example of a semiconductor structure obtained at an intermediate stage of fabrication, the structure including a semiconductor substrate, a mask layer disposed over the semiconductor substrate, a plurality of mandrels over the mask layer and a spacer material conformally disposed over the mandrels, in accordance with one or more aspects of the present invention.

FIG. 2 depicts one example of the intermediate structure of FIG. 1 with the spacer material removed above the mandrels, in accordance with one or more aspects of the present invention.

FIG. 5 depicts one example of the intermediate structure of FIG. 4 after patterning of the semiconductor substrate to create raised semiconductor structures, in accordance with one or more aspects of the present invention.

FIG. 6 depicts one example of resultant structure of FIG. 5 after removal of the spacer and hard mask layers, in accordance with one or more aspects of the present invention.

FIG. 9 is a cross-sectional view of an alternate diode with merged anode-cathode implants and multiple contacts on a wide fin from FIG. 6, in accordance with one or more aspects of the present invention.

FIG. 10 is a cross-sectional view of a silicon controlled rectifiers with multiple contacts, on a wide fin from FIG. 6, in accordance with one or more aspects of the present invention.

DETAILED DESCRIPTION OF THE INVENTION

Figure 3:
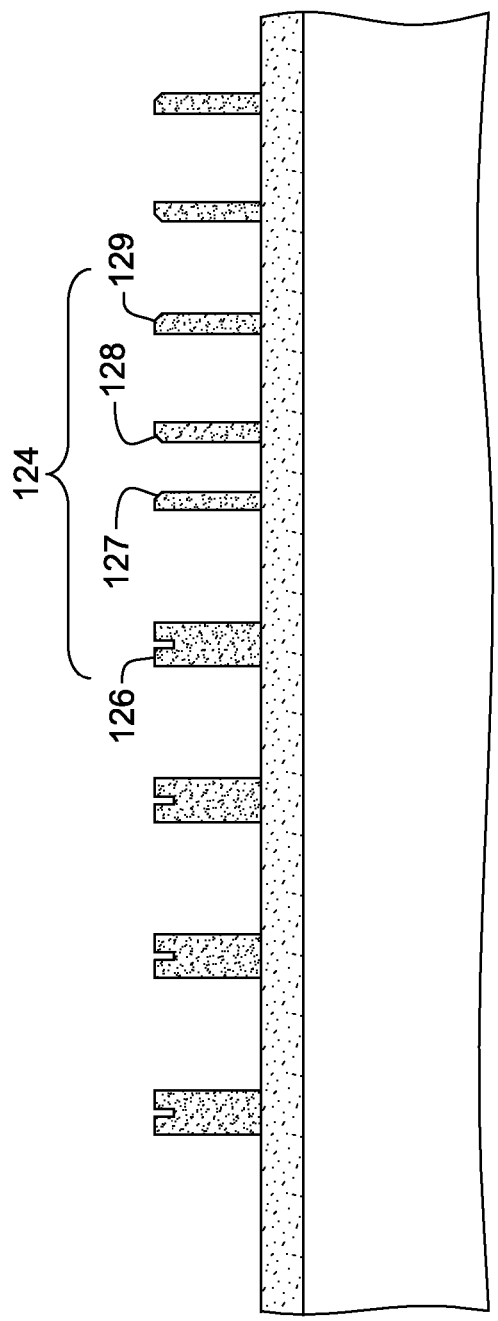
FIG. 3 depicts one example of the intermediate structure of FIG. 2, with the mandrels having been removed, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional elevational view of one example of an intermediate semiconductor structure obtained at an intermediate stage of fabrication of one or more semiconductor devices, in accordance with one or more aspects of the present invention. At the point of fabrication depicted in FIG. 1, intermediate structure 100 includes a substrate 102, for example, a bulk semiconductor material, e.g., a bulk silicon wafer. In one example, substrate 102 may include any silicon-containing substrate including, but not limited to, silicon (Si), single crystal silicon, polycrystalline silicon (Poly-Si), amorphous Si, silicon-on-nothing (SON), silicon-on-insulator (SOI), or silicon-on-replacement insulator (SRI) substrates and the like. Substrate 102 may in addition or instead include various isolations, dopings and/or device features. The substrate may include other suitable elementary semiconductors, such as, for example, germanium (Ge) in crystal, a compound semiconductor such as silicon carbide (SiC), gallium arsenide (GaAs), gallium antimondie (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Continuing with FIG. 1, a mask layer 104 is disposed over substrate 102. Mask layer 104, which may be deposited over substrate 102 using any conventional deposition processes, such as CVD, PVD or ALD, and provides protection to substrate 102 from damage during subsequent etch processes, and depending on the fabrication process, may also prevent substrate 102 from being oxidized by exposure to an oxygen-containing environment. In one specific example, mask layer 104 may include a nitride material, such as silicon nitride ($Si_3N_4$ or SiN), silicon dioxide ($SiO_2$), SiON and the like. Although mask layer 104 may have a thickness suitable to act as an etch stop layer to protect substrate 102 from damage, the thickness of mask layer 104 may vary according to the processing node in which the semiconductor device is being fabricated. In one example, the thickness of mask layer 104 may be about 5 nm to about 500 nm for a 14 nm technology node.

Referring still to FIG. 1, a sacrificial mandrel material 106 is patterned over mask layer 104 to create one or more mandrels 108, e.g., mandrels 110, 112, 114 and 115. Sacrificial mandrel material 106 may be provided over mask layer 104 using, for instance, any conventional deposition processes, such as atomic layer deposition (ALD), chemical-vapor deposition (CVD), physical vapor deposition (PVD) or the like. In one example, the sacrificial mandrel material may include a material such as, for example, amorphous silicon or polycrystalline silicon. As one skilled in the art will understand, although not depicted in figures, the patterning of the sacrificial mandrel material may typically include, for instance, providing an anti-reflective coating layer over sacrificial mandrel material 106, and providing a patterned photoresist layer over the anti-reflective layer. The patterning process may proceed using a desired mask pattern, to transfer the pattern from the patterned photoresist layer and to etch through the layers, including sacrificial mandrel material 106. Note that this patterning process may create, in one example, mandrels 110 and 112 separated by a space 116 that is substantially less than the space 118 separating the mandrels 114 and 115. As will be explained in more detail below, mandrels that are close together (e.g., mandrels 110 and 112) are associated with the creation of one or more electrostatic discharge (ESD) semiconductor devices on a same substrate (here, same wafer) as one or more non-ESD semiconductor devices, with which the farther-spaced mandrels (e.g., mandrels 114 and 115) are associated. In other words, fins subsequently created from the more closely spaced mandrels will have ESD devices at a top portion thereof, while non-ESD devices (e.g., FinFETs) will be created on fins fabricated using the more spaced mandrels.

Continuing further with FIG. 1, a sidewall spacer material 120 is conformally deposited over mandrels 108. Sidewall spacer material 120 may include, for instance, an oxide material such as, for example, silicon oxide ($SiO_2$), which may be conformally deposited using a variety of techniques, such as, for example, chemical vapor deposition (CVD) or atomic layer deposition (ALD). Note that sidewall spacer material 120 may be disposed over and along the sidewalls of mandrels 108.

As depicted in FIG. 2, the sidewall spacer material is removed from above the mandrels (see FIG. 1), for instance, by etching using any appropriate non-selective etching processes, to form sidewall spacers 124, e.g., spacers 126, 127, 128 and 129. In one example, a non-selective chemical mechanical polish may be performed to remove the sidewall spacer material from above the mandrels, while leaving it along the sidewalls of the mandrels. Note that between the more closely spaced mandrels, the sidewall spacer material creates a merged spacer 126 within the space 116 (see FIG. 1) separating the mandrels and unmerged spacers 127, 128 and 129. The merged aspect of the spacers advantageously facilitate in doubling their width, and, hence, increasing the width of resulting fins, as described below. In addition, the increased width decreases the distance (also referred to as pitch, as understood in the art) between two merged spacers as compared to unmerged spacers, during subsequent processing. Etching the sidewall spacer material from above the mandrels (see FIG. 1) results in exposing underlying sacrificial mandrel material 106.

As illustrated in FIG. 3, exposed sacrificial mandrel material 106 (see FIG. 2) is subsequently etched, using a selective etch processing, resulting in exposing underlying mask layer 104, while leaving sidewall spacers that may be used as a hard mask during subsequent processing. The selective etch process may be one or more anisotropic, dry-etch processes, such as, for example, oxygen strip or plasma etching processing. As discussed above, the hard mask includes merged spacer 126 having a width that is substantially greater than the width of unmerged spacers 127 and 128. In a specific example, the width of merged spacer 126 may be approximately two times the width of unmerged spacers 127 and 128.

Figure 4:
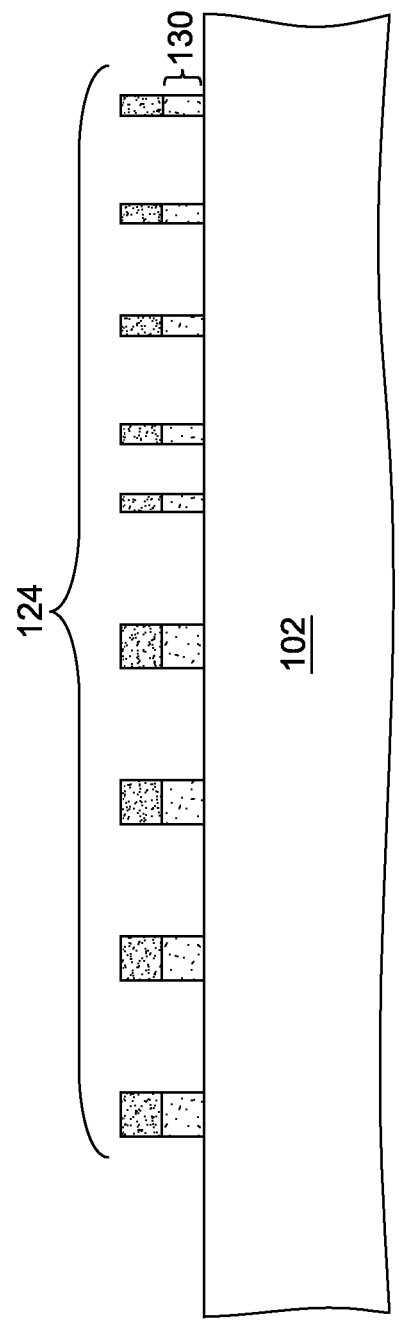
FIG. 4 depicts one example of the intermediate structure of FIG. 3 after patterning of the hard mask layer, in accordance with one or more aspects of the present invention.

As illustrated in FIG. 4, mask layer 104 (see FIG. 3) may be patterned using the sidewall spacers to create a mask pattern 130. This mask pattern 130 may then be used in patterning underlying semiconductor substrate 102 to create fins, or, more generally, raised semiconductor structures. Any conventional anisotropic dry-etching processes such as, reactive ion etching or plasma etching may be performed to etch through mask layer 104 and to create the mask pattern. In a specific example, reactive ion etching may be performed using remote plasma involving process gases such as nitrogen trifluoride ($NF_3$) and hydrogen ($H_2$). In another example, anisotropic dry etching process, such as reactive ion etching using fluorine-based chemistry involving process gases such as tetrafluoromethane ($CF_4$), trifluoromethane ($CHF_3$), sulfur hexafluoride ($SF_6$) may be employed.

One or more etching processes may be performed to selectively pattern a portion of semiconductor substrate 102 using mask pattern 130 and the sidewall spacers, as depicted in FIG. 5, to create one or more raised structures 132, e.g., raised structures 134 and 136, separated by a space 138. Note that the resulting one or more raised structures 132 such as, for example, semiconductor fins, are coupled to a portion of semiconductor substrate 102. Note also that, there exists a width variation between raised structure 134 and raised structure 136, resulting from width variations caused by merged spacers 126 and unmerged spacers 127 and 128. Further, the width of raised structure 134 and raised structure 136 is at least equal to (and gradually downward, larger than) the width of merged spacers 126 and unmerged spacers 127 and 128, respectively. In a specific example, the width of raised structure 134, being approximately equal to the width of merged spacers 126 at a top portion 135 thereof and gradually getting larger at a base 137, may be in the range of about 10 nanometers to about 40 nanometers, while the width of raised structures 136, dictated by unmerged spacer 127, may be in the range of about 5 nanometers to about 30 nanometers.

As shown in FIG. 6, a non-selective chemical-mechanical polish or non-selective etching may be employed to remove the remaining portion of the sidewall spacers (see FIG. 4) and remaining portions of mask pattern 130 (see FIG. 4) overlying raised structures 132. As understood, "non-selective" in this context means that the polish rate or etch rate is close between the sidewall spacers of FIG. 4 and the mask pattern of FIG. 4, which in one example, are an oxide and nitride materials, respectively. Note that this non-selective removal processes, e.g., non-selective chemical-mechanical polish or non-selective etching processes result in creating at least one or more wider raised structures 133 and at least one or more standard width raised structures 135, on the same semiconductor wafer.

The present invention proceeds to create one or more electrostatic discharge (ESD) devices over the top portion of at least one of the wider raised structures 133, for example, over the top portion of raised structure 134. The fabrication of an electrostatic discharge (ESD) device over the top portion of raised structure 134 provides a larger width as compared to the more standard width of raised structures 135, e.g., raised structure 136, advantageously facilitating in handling a larger electrostatic discharge (ESD) current as compared to an electrostatic discharge (ESD) current that could be handled by an ESD device on one of the standard width raised structures 135. Electrostatic discharge (ESD) devices may include, for example, a diode, a bipolar junction transistor (BJT) and a silicon controlled rectifier (SCR), with the simplest of those structurally being, of course, a diode. BJTs and SCRs are best suited for high voltage situations, while diodes are best suited to large current transients, due to their fast turn-on. Thus, the following example uses diodes in order to simplify the description and resulting understanding of the invention.

Figure 7:
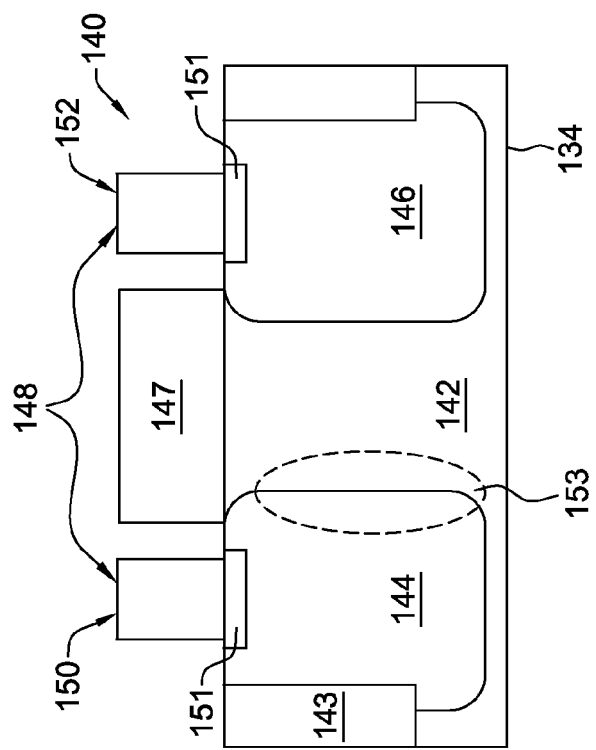
FIG. 7 is a cross-sectional view of a diffused diode with multiple contacts on a wide fin from FIG. 6, in accordance with one or more aspects of the present invention

As depicted in FIG. 7, diodes may be formed on three-dimensional (3D) semiconductor structures, such as, for example, fins similar to those used with FinFETs. Diode 140 includes a well 142 at a top of one or more wider raised structures, for example, raised structure 134 from FIG. 6, the well including either a p-type dopant or an n-type dopant, depending on the conductivity type-PNP or NPN- of the diode. In addition, it will be understood that such a diode can be used in forward biased, reverse biased or circuits mode. In a specific example, well 142 has an n-type dopant, and includes an anode implant (AI) 144, the anode implant 144 being of opposite type than the n-type well 142, and a cathode implant (CI) 146, the cathode implant 146 being the same type as n-type well 142. Note that the depth of the anode implant (AI) and the cathode implant (CI) may be substantially deeper than conventional source and drain implants. In one example, the depth of anode implant (AI) 144 and cathode implant (CI) 146 may be in the range of about 0.2 μm to about 2 μm. Note that the increased depth of such a diode 140, advantageously, facilitates in handling more current with low on-resistance ($R_{on}$). The fabrication may further proceed to create gate structure 147 and multiple contacts 148, for example, contacts 150 and 152 to improve current handling. In one example, contact 150 may be electrically coupled to anode implant (AI) 144, whereas contact 152 may be electrically coupled to cathode implant 146, to further improve current handling. Multiple contacts 148, in one example, may include a silicide 151, such as, for example, nickel silicide, titanium silicide, platinum silicide and the like. Note that in this implementation, the conventional semiconductor fins may be placed parallel or perpendicular to the diode junction boundary; in this case, the boundary 153 is perpendicular to fin 134. Although not critical to the invention, each of these diodes may be separated by isolation features, such as, for example, shallow trench isolation features 143.

Figure 8:
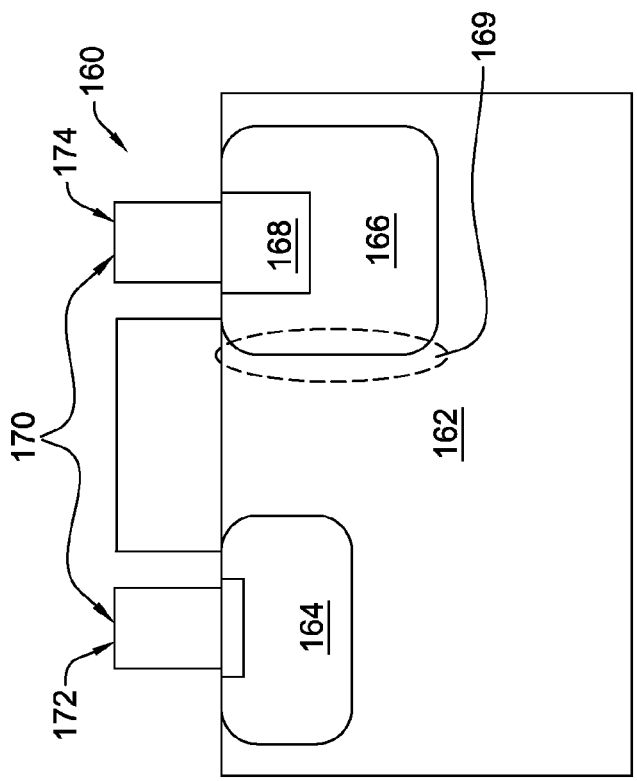
FIG. 8 is a cross-sectional view of an alternate diffused diode with additional n-well implants and multiple contacts, on a wide fin from FIG. 6, in accordance with one or more aspects of the present invention.

Alternately, as depicted in FIG. 8, each of the diodes, e.g., diode 160, may also include a well 162 in the at least one wider raised structure, for example, raised structure 134 from FIG. 6, the well including either a p-type dopant or an n-type dopant, depending on the conductivity type-PNP or NPN- of the diode. In a specific example, first well 162 has a p-type dopant, and includes an anode implant (AI) 164, the anode implant 164 being of a same type as the p-type well 162. well 162 may also include a well 166 within, for instance, the p-type well 162. In such a case, well 166 may be of opposite type than the first well 162, and a cathode implant (CI) 168 may be disposed within well 166, the cathode implant 146 being the same type as well 166. Note that, in this implementation, the diode junction area is formed by the boundary of well 166 to first well 162, and that the area of the diode may be altered to attain low on-resistance ($R_{on}$). Note also that the conventional semiconductor fins may be placed parallel or perpendicular to the diode junction boundary (in this case being perpendicular). The fabrication may further proceed to create the gate structure and multiple contacts 170, for example, contacts 172 and 174 to improve current handling. In one example, contact 172 may be electrically coupled to anode implant (AI) 164, whereas contact 174 may be electrically coupled to well 166 via cathode implant 168, to further improve current handling. Multiple contacts 170, in one example, may include a silicide such as, for example, nickel silicide, titanium silicide, platinum silicide and the like.

In yet another alternate implementation, as illustrated in FIG. 9, each diode 176 may include a well 178 in the at least one wider raised structure, for example, raised structure 134 from FIG. 6, the well including either a p-type dopant or an n-type dopant, depending on the conductivity type-PNP or NPN- of the diode. In a specific example, well 178 has an n-type dopant, and includes an anode implant (AI) 180, the anode implant being the opposite type as the n-type well 178, and a cathode implant (CI) 182, the cathode implant being of the same type as n-type well 178. In this implementation, anode implant (AI) 180 and cathode implant (CI) 182 are extended toward each other, as compared to the examples above, such that the anode implant and the cathode implant may be merged with each other to form a highly doped junction region 183, the highly doped junction region being capable of acting as a Zener diode under reverse bias conditions. One skilled in the art will note that, such a diode can provide a low reverse biased resistance to an electrostatic discharge (ESD) event. In one example, the depth of anode implant (AI) 180 and cathode implant (CI) 182 may be in the range of about 0.05 µm to about 3 µm. The fabrication may further proceed to create the gate structure and multiple contacts 184, for example, contacts 186 and 188, to improve current handling. In one example, contact 186 may be electrically coupled to anode implant (AI) 180, whereas contact 188 may be electrically coupled to cathode implant 182, to further improve current handling. Multiple contacts 184, in one example, may include a silicide such as, for example, nickel silicide, titanium silicide, platinum silicide and the like.

In yet another example, Silicon Controlled Rectifiers (SCRs) serve as ESD devices, and are also be fabricated over at least one wider raised structure, e.g., raised structure 134 from FIG. 6. In one example, as illustrated in FIG. 10, Silicon Controlled Rectifier (SCR) 189 includes a diode 190, each of the diode including a well 192, a well 194 and third well 200, in the at least one wider raised structure, for example, raised structure 134 from FIG. 6, each of the well, the well and the third well including either a p-type dopant or an n-type dopant, depending on the conductivity type-NPNP or PNPN- of the SCR. Well 192 and third well 200 are both of the same type (n-type or p-type), while middle well 194 is either a well of the opposite type or simply a substrate of the opposite type. A junction 195 lies between well 192 and implant 196. In a specific example, well 192 has an n-type dopant and anode implant (AI) 196 is p-type, i.e., of opposite type to well 192, and adjacent well 194 has a p-type dopant and includes an anode implant (AI) 198 that is a same type as well 194. Further, a third well 200 is disposed adjacent to well 194, the third well having an n-type dopant and a cathode implant (CI) 202 that is of the same type as the third well 200. A junction 197 is situated between well (or p-type substrate) 194 and third well 200.

Optionally, the anode and cathode implants may be deep, as described in prior examples, though not merged, and the orientation of the raised structures may be parallel or perpendicular to the junction boundaries (here, the raised structure is perpendicular to the junctions). The fabrication may further proceed to create the gate structure and multiple contacts 204, for example, contacts 206, 208 and 210, to improve current handling and optimize the parasitic bipolar aspect (with contact 208). In one example, contact 206 may be electrically coupled to anode implant (AI) 196, contact 208 may be electrically coupled to anode implant 198 and contact 210 may be electrically coupled to cathode implant 202, to further improve current handling. Multiple contacts 204, in one example, may include a silicide such as, for example, nickel silicide, titanium silicide, platinum silicide and the like.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor device, comprising:
    a semiconductor substrate;
    at least one raised semiconductor structure coupled to the substrate, the at least one raised structure having a width of about 5 nm to about 50 nm; and
    at least one electrostatic discharge (ESD) semiconductor device situated at a top portion of the at least one raised structure, wherein the at least one ESD device comprises a diode, and wherein the diode comprises:
        a well in the at least one raised structure, wherein the well is one of n-type and p-type;
        an anode of a type opposite the well and having a depth in the well of about 0.05 µm to about 3 µm;
        a cathode of a same type as the well and having a depth in the well of about 0.05 µm to about 3 µm;
        at least one contact electrically coupled to the anode; and
        at least one other contact electrically coupled to the cathode.

2. The semiconductor device of claim 1, further comprising a plurality of current-handling contacts electrically coupled to the diode.

3. The semiconductor device of claim 2, wherein the substrate and the at least one raised structure comprise silicon, and wherein the plurality of current-handling contacts comprise a silicide.

4. The semiconductor device of claim 3, wherein the silicide comprises one of nickel silicide, titanium silicide, and platinum silicide.

5. The semiconductor device of claim 1, wherein the anode and the cathode are merged at a junction thereof.

6. The semiconductor device of claim 1, wherein the diode comprises:
    an anode of p-type or n-type;
    a first well of a type opposite the anode;

a cathode in the first well of a same type as the first well;
at least one contact electrically coupled to the anode; and
at least one other contact electrically coupled to the cathode.

7. The semiconductor device of claim 6, further comprising a second well of a same type as the anode, wherein the second well encompasses the anode, the first well and the cathode.

8. The semiconductor device of claim 6, wherein the substrate is of a same type as the anode.

9. The semiconductor device of claim 1, wherein the ESD device comprises a bipolar junction transistor.

10. A semiconductor chip, comprising:
a bulk semiconductor substrate;
a plurality of raised semiconductor structures coupled to the substrate, at least one and less than all of the plurality of raised semiconductor structures having a width of about 5 nm to about 50 nm, wherein at least one and less than all of the plurality of raised structures is wider than a remainder of the plurality of raised structures;
a plurality of electrostatic discharge (ESD) semiconductor devices situated within top portions of the wider raised semiconductor structures; and
a plurality of at least one type of non-ESD semiconductor device situated at top portions of the remainder of the plurality of raised semiconductor structures.

11. The semiconductor chip of claim 10, wherein the plurality of ESD devices comprises at least one of a diode and a bipolar junction transistor.

12. The semiconductor chip of claim 10, wherein each of the ESD semiconductor devices comprises:
a well in the at least one raised structure, wherein the well is one of n-type and p-type;
an anode of a type opposite the well and having a depth in the well of about 0.05 μm to about 3 μm;
a cathode of a same type as the well and having a depth in the well of about 0.05 μm to about 3 μm;
at least one contact electrically coupled to the anode; and
at least one other contact electrically coupled to the cathode.

* * * * *